US006384319B1

(12) United States Patent
Sasaki et al.

(10) Patent No.: US 6,384,319 B1
(45) Date of Patent: May 7, 2002

(54) NON-SINGLE-CRYSTAL SOLAR CELL

(75) Inventors: Toshiaki Sasaki; Shinji Fujikake, both of Kanagawa (JP)

(73) Assignee: Fuji Electric & Co., Ltd. (JP)

( * ) Notice: Subject to any disclaimer, the term of this patent is extended or adjusted under 35 U.S.C. 154(b) by 0 days.

(21) Appl. No.: 09/526,067

(22) Filed: Mar. 15, 2000

(30) Foreign Application Priority Data

Mar. 15, 1999 (JP) .............................. 11-068436

(51) Int. Cl.[7] .............................................. H01L 31/075
(52) U.S. Cl. ..................... 136/258; 136/252; 136/255; 136/290; 257/53; 257/55; 257/431; 257/458; 257/464; 438/96; 438/97; 438/57
(58) Field of Search ................... 136/258 AM, 258 PC, 136/252, 255, 290; 257/53, 55, 431, 458, 464; 438/96, 97, 57

(56) References Cited

U.S. PATENT DOCUMENTS 5,507,881 A * 4/1996 Sichanugrist et al. ....... 136/258

5,824,566 A * 10/1998 Sano et al. ................... 438/69

FOREIGN PATENT DOCUMENTS

EP 0831538 A2 * 3/1998

OTHER PUBLICATIONS

Isomura, "The Light–Induced Increase in Open Circuit Voltage of Amorphous Silicon Solar Cells," Proceedings of the 2nd World Conference on Photovoltaic Solar Energy Conversion, Vienna, Austria, pp. 925–928, Jul. 6–10, 1998.*

* cited by examiner

Primary Examiner—Alan Diamond
(74) Attorney, Agent, or Firm—Rossi & Associates

(57) ABSTRACT

The film thickness of a p-type semiconductor was adjusted in order to achieve 0.85–0.99 times the maximum pre-irradiation open-circuit voltage. In order to achieve 0.85–0.99 times the maximum pre-irradiation open-circuit voltage, it was also shown to be favorable to control acceptor impurity levels in p-type semiconductors. Irradiation conditions of more than 10 hours at 1 SUN or (light intensity $[SUN])^2 \times 10$ or more (time $[h])>10$ were utilized.

5 Claims, 5 Drawing Sheets

NON-SINGLE-CRYSTAL SOLAR CELL

FIELD OF THE INVENTION

The invention relates in general to thin-film solar cells using a non-single-crystal thin-film. More specifically, the invention provides a non-single-crystal solar cell that is especially efficient in post-irradiation,

BACKGROUND OF THE INVENTION

When compared to monocrystal silicon solar cells, PIN thin-film solar cells, having at least one PIN junction, namely, a lamination of a p-type semiconductor layer of non-single-crystal thin-film (hereafter referred to as "p-layer"), a substantially intrinsic i-type semiconductor layer (referred to below as "i-layer"), and an n-type semiconductor layer (referred to below as "n-layer"), and especially PIN thin-film solar cells, using non-single-crystal thin-films such as silicon-derived amorphous silicon (referred to below as "a-Si"), microcrystalline silicon (referred to below as "$\mu$c-Si"), and polycrystalline silicon, can be made large in area, at low temperatures, and at low cost, and as such, are promising for use as a large-area thin-film solar cell to generate electric power.

"The substantially intrinsic i-layer" described in this specification is not limited to undoped semiconductor layer. Amorphous semiconductors, even if intentionally undoped, are sometimes automatically doped by diffusion of residual gas or impurity emitted from the inner surface of a chamber wall during deposition, and thus Fermi energy may be shifted from the center of the bandgap. A semiconductor layer compensated such that the Fermi energy is located at the center of the bandgap by microdoping p or n-type impurity also includes "substantially intrinsic i-layer".

Examples have been reported where wide-gap a-Si alloy and $\mu$c-Si were applied as the material for the player, the window layer of the PIN-type solar cell, for the purpose of increasing the efficiency of the non-single-crystal solar cell. Amorphous silicon carbide (hereafter referred to as "a-SiC"), amorphous silicon oxide (hereafter referred to as "a-SiO"), and amorphous silicon nitride (hereafter referred to as a-SiN), among others, were brought together to form the a-Si alloy. It has been shown that using these materials in the p-layer results in increased short circuit current density (hereafter referred to as "Jsc") due to a reduction in light absorption loss, and an increase in open-circuit voltage (hereafter referred to as "Voc") from increased diffusion potential.

It is known, however, that non-single-crystal solar cells, and a-Si solar cells in particular, experience reduced efficiency with illumination. As to the special features of the initial period, following irradiation there is, on the whole, a reduction in Voc, Jsc, and the curved factor (hereafter referred to as FF), respectively, and a decline in efficiency (hereafter referred to as Eff).

Until now, p-layer conditions have mostly been optimized with regard to the peculiar characteristics of the initial period, and what was optimized for the initial period was thought to be equally optimal for post-irradiation, but not much consideration has really ever been given to the peculiar characteristics of post-irradiation.

In contrast, there has recently been reported instances whereby application to the i-layer of an a-Si film made with hydrogen-diluted silane, resulted in an increase in post-irradiation Voc. For example, Siamchai et al., who used the photo-CVD method, report that when you raise the hydrogen dilution levels for the i-layer in an a-Si solar cell with no p-i interface layer, post-irradiation Voc increases against the initial period, and that the cause of this is attributable to a disparity in defect energy within the i-layer due to hydrogen dilution [Pavan Siamchai and Makoto Konagai, Proc. IEEE 25th Photovoltaic Specialists Conference (1996) pp. 1093; Pavan Siamchai and Makoto Konogai, Appl. Phys. Lett., Vol.67 (1995) pp.3468]. The post-irradiation Eff in a-Si solar cells with increased Voc from illumination, however, did not exceed the Eff in a-Si solar cells which includes the p-i interface layer and exhibits ordinary degradation under illumination. Furthermore, they are of the opinion that increases in Voc by irradiation depends on the conditions under which the i-layer is prepared.

Meanwhile, Isomura et al. report that when they used the plasma CVD method and diluted silane with hydrogen by ten times or more, they achieved an increase in post-irradiation Voc, and believe the reason has nothing to do with either the p-layer or the p-i interface layer [Masao Isomura, Hiroshi Yamamoto, Michio Kondo and Akihisa Matsuda, Proc. $2^{nd}$ World Conference on Photovoltaic Energy Conversion, to be published]. However, even in this case, whatever increased Voc as a result of irradiation did not lead to a rise in Eff. This report also states that the increases in Voc by irradiation depend upon the conditions under which the i-layer is prepared.

Furthermore, Xi et al. report raising Voc through the optimization of the a-SiC p-layer comprised of large quantities of carbon (hereafter referred to as "C"), and p-i interface layer, and that whenever Voc was low in the initial period, post-irradiation Voc increased [Jinping Xi, Tongyu Liu, Vincent Iafelice, Martin Nugent, Kevi Si, Joe del Cueto, Malathi Ghosh, Frank Kampas, Proc. $23^{rd}$ IEEE Photovoltaic Specialists Conference (1993) pp.821]. However, when post-irradiation Voc increased, no increases in Eff were exhibited. Further, nothing regarding any link between the conditions of p-layer or p-i interface layer preparation and the increases in post-irradiation Voc was reported in any concrete fashion.

An increase Eff has been sought using a wide gap non-single-crystal alloy and $\mu$c-Si in the p-layer of our non-single-crystal PIN solar cell,. However, Eff needs to increase to even a greater extent before it can be put to real use.

Moreover, insofar as the conditions for the p-layer were concerned, it had been believed that the elements which had been optimized in accordance with the initial period's peculiar characteristics would also be optimal in the post-irradiation period. The problem, however, is that these conditions were not necessarily optimal given the peculiar characteristics of post-irradiation. For example, as was mentioned above, Voc increased in post-irradiation because of the manner in which the i-layer was prepared, but without resulting in an increased post-irradiation Eff.

In light of this problem, it is an object of the present invention to provide non-single-crystal solar cell that is especially efficient in post-irradiation, and doing so by focusing on the peculiar characteristics of post-irradiation.

SUMMARY OF THE INVENTION

In order to resolve the problem discussed above, the inventors performed their own experiments by taking a p-layer, for example, whose Voc and other elements were optimized in the initial period's peculiar characteristics, and observing closely what was not optimal about it in post-irradiation. By paying particular attention to the specific characteristics of post-irradiation, particularly with regard to efficiency, conditions were established that would maximize its efficiency. More precisely, taking non-single-crystal solar cell having at least one PIN junction, formed by laminating together of a p-type semiconductor layer made from non-single-crystal thin-film, a substantially intrinsic i-type semiconductor layer and an n-type semiconductor layer, things like film thickness and acceptor impurity levels of the above-mentioned p-type semiconductor layer were adjusted in an effort to achieve 0.85–0.99 times the maximum pre-irradiation open-circuit voltage value in this non-single-crystal solar cell before performing irradiation.

As described in greater detail below, experiments were conducted to change the material, film thickness and impurity levels in the p-type semiconductor layer. In each instance, the results endeavored to be achieved were the same: 0.85–0.99 times the pre-irradiation open-circuit voltage. In this case, it is possible to achieve a higher efficiency rate after the irradiation than in the case where the pre-irradiation open-circuit voltage is the maximum value.

The results will now be described in greater detail. Initial period Voc increased along with increased film thickness (Dp), and achieved its maximum at a certain thickness. The term "Dpsat" will be used to identify the thickness at which initial period Voc reached its highest level. However, as Dp gets thicker, the p-layer light absorption loss increases and Jsc decreases. Hence, the efficiency rate in the initial period is at its highest somewhere around Dp=Dpsat.

Meanwhile, it was observed that Voc increases in the lab when irradiation on a non-single-crystal solar cell whose Dp<Dpsat was performed. Next, the film thickness of Dpsat-2, at which post-irradiation Voc reached its highest point, was thinner than Dpsat. Due to the thinness of the Dpsat-2 film, the cells within its vicinity experienced a decrease in light absorption loss and an increase in Jsc. The post-irradiation efficiency rate of Dpsat-2 is, thus, higher than in Dpsat cells. When attempts are made to make the Dpsat-2 film even thinner, irradiation results in increased Voc, but unfortunately, Voc's absolute value decreases. However, if balanced with the increased Jsc from a thin Dp, up to certain thicknesses the efficiency rate is higher than in Dpsat cells.

The parameters in which efficiency in Dpsat cells becomes higher were as follows: when controlling the p-layer thickness and impurity levels in an effort to attain 0.85–0.99 times the maximum value in initial period Voc, an increase in post-irradiation efficiency was consistently achieved. If Voc is lower than 0.85 times the maximum value of the initial period Voc, the post-irradiation efficiency is lowered.

The mechanism by which irradiation results in Voc increases is not presently understood, but it has been concluded that this increase in Voc is not something that occurs because of increases in the photocurrent, but because of decreases in the dark current.

Around the time of irradiation, the dark current voltage shifts to a high voltage, and it is believed that this results in changes in the distribution potentials of the transparent electrodes, the p-layer, the p-i interface, and the i-layer. Further, around the time of irradiation, on the semi-logarithmic plot the tendency of the dark current after irradiation is to get smaller, and the n-value of the diode is to get bigger, while the proportion of the recombination current vis-a-vis the diffusion current increases. Meanwhile, it is believed that the reason why the shift in the voltage arising from dark current appears as a Voc increase is because the absolute value of dark current, occurring in bias currents whose voltage is lower than Voc, is smaller in comparison to that of photocurrent, and because it is not very efficient as a leakage current.

Furthermore, when heat annealing for several hours at 100° C.–150° C. is performed, the increases in irradiation induced Voc return to their initial period values. It is, therefore, not a process whereby the diffusing impurities and the like are irreversible. It can be considered that the increase of Voc resulting from the irradiation relates to a reversible process such as the generation of flows that arises from the irradiation and the elimination of the flows through heat annealing.

The p-type semiconductor layer is comprised of an amorphous silicon alloy made from a-Si or a-SiO, a-SiC, a-SiN, $\mu$c-Si or microcrystalline silicon oxide, microcrystalline silicon carbide, microcrystalline silicon nitride; or polycrystalline silicon.

Although experiments were performed on p-type semiconductor layers made of a-SiO and $\mu$c-Si, it is believed that similar results would be obtained using the other materials listed above and wide-gap semiconductors.

Below is documented the results obtained when a-SiO is used for the p-type semiconductor layer, and set the thickness of said p-type semiconductor layer at 0.25–0.83 times the thickness of a p-type semiconductor layer whose pre-irradiation open-circuit voltage is the greatest, specifically when the thickness is set at 3–10 nm.

Below is documented the results obtained following irradiation when $\mu$c-Si is used for the p-type semiconductor layer, and the thickness of said p-type semiconductor layer is set at 0.08–0.83 times the thickness of a p-type semiconductor layer whose pre-irradiation open-circuit voltage is the greatest, specifically when the thickness is set at 5–50 nm.

It is also advisable to have a p-i interface layer made from non-single-crystal thin-film between the layers of the i-type semiconductor and the p-type semiconductor.

Whether there was or was not a p-i interface layer had somewhat of an effect on the absolute value of Voc or efficiency "Eff". But in either case, increases in Voc following irradiation were observed when p-type semiconductor layers were in the thin range and obtained similar results.

The experiments made it clear that if the irradiation is performed for 10 hours or more at a light intensity of 1 SUN, or on conditions that (a light intensity $[SUN])^2 \times (hour[h])$ >10, the characteristics are stabilized.

BRIEF DESCRIPTION OF THE DRAWINGS

The invention will be described with reference to certain preferred embodiments thereof along with the accompanying drawings, wherein.

DETAILED DESCRIPTION OF THE PREFERRED EMBODIMENTS

EXAMPLE 1

Figure 2:
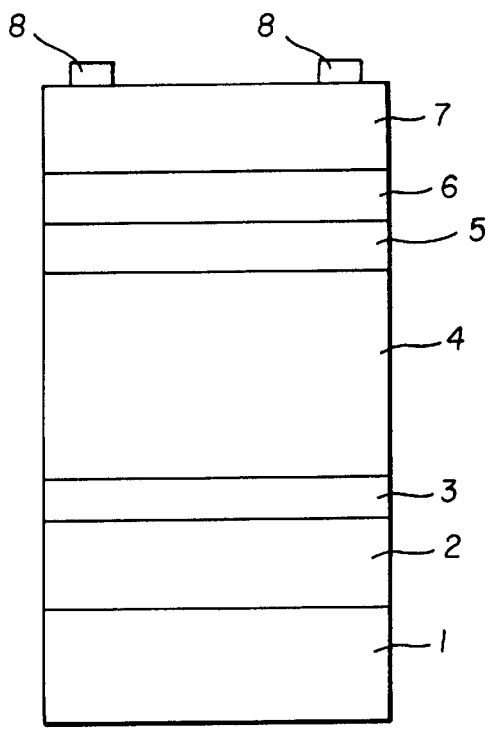
FIG. 2 is a cross-sectional view of non-single-crystal solar cell in accordance with a first embodiment of the invention.

FIG. 2 is a cross-sectional drawing that shows the construction of the non-single-crystal solar cell in accordance with a first embodiment of the invention. This type of thin-film solar cell will simply be referred to as "cell".

On top of a glass substrate 1, laminated in succession, is a metallic electrode 2, an n-layer 3 made of a-Si, an i-layer 4 made of a-Si, a p-i interface layer 5 made of a-SiO, a p-layer 6 made of a-SiO and transparent electrode 7, on top of which a grid electrode 8 has been laid down.

Silver or aluminum are used, for example, in metallic electrode 2, and the n-layer 3 has a thickness of 10–50 nm, the i-layer 4 has a thickness of 100–500 nm, the p-i surface layer 5 has a thickness of 10–50 nm, the p-layer 6 has a thickness of 2–16 nm, and transparent electrode 7 uses indium tin oxide (hereafter referred to as ITO) and zinc oxide (hereafter referred to as ZnO). Grid electrode 8 is also preferably silver.

The construction of the cell shown in FIG. 2 will now be described. Metallic electrode 2 is formed onto glass substrate 1 using a sputtering or evaporation method. Next, the n-layer 3 made from a-Si, the i-layer 4 made from a-Si, the p-i interface layer 5 made from a-SiO, and the p-layer 6 made from a-SiO are formed consecutively using a plasma CVD method. The conditions for forming these films during this time are as follows: the substrate temperature is 60–300° C., and the reaction pressure is approximately 10–100 Pa. The gas flow volume each thereof during the time formation of n-layer 3 takes place are as follows: monosilane (hereafter referred to as $SiH_4$) at 10–200 ml/min., phosphine (hereafter referred to as $PH_3$) at 0.1–2 ml/min., hydrogen (hereafter referred to as $H_2$) at 100–2000 ml/min. The gases and flow volume each thereof during the time of formation of i-layer 4 takes place are as follows: $SiH_4$ at 10–2000 ml/min., and $H_2$ at 10–2000 ml/min. The gases and flow volume each thereof during the time of formation of p-i interface layer 5 takes place are as follows: $SiH_4$ at 10–100 ml/min., carbon dioxide gas (hereafter referred to as $CO_2$) at 1–50 ml/min., and $H_2$ at 200–2000 ml/min. The gases and flow volume each thereof during the time of formation of p-layer 6 takes place are as follows: $SiH_4$ at 10–200 ml/min., $CO_2$ at 10–1000 ml/min., diboran (hereafter referred to as $B_2H_6$) at 0.1–2 ml/min., and $H_2$ at 100–2000 ml/min.

Figure 3:
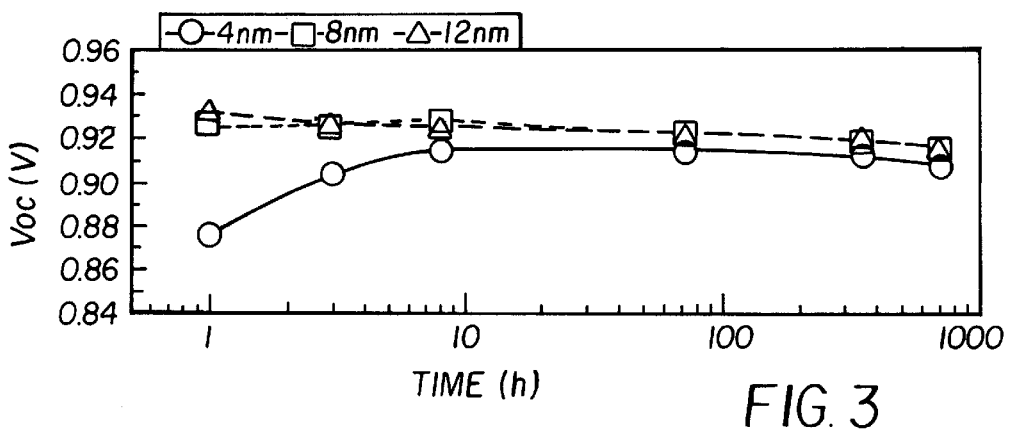
FIG. 3 is a special characteristics graph showing post-irradiation time reliability of the Voc of the solar cell illustrated in FIG. 2.

Following this, transparent electrode 7 is formed using a sputtering or evaporation method, and thereupon grid electrode 8 is formed. FIG. 3 is a graph of distinct characteristics showing the irradiation time reliability of Voc in the cell of FIG. 2 manufactured in the manner described above. The vertical axis represents Voc and the horizontal axis represents time expressed in logarithms. Irradiation is performed at an intensity of 1 SUN (AM 1.5, 100 m $W/cm^2$) and at a temperature of 40–50° C. Three kinds of cells are shown in which the thickness of their p-layer 6, made from a-SiO, varies, each at 4 nm, 8 nm, and 12 nm.

Initial period Voc values were the highest in cells with a p-layer 6 film thickness of 12 nm., followed by those with a thickness of 8 nm and 4 nm, in that order. When irradiation was performed, cells with a p-layer 6 thickness of 12 nm showed gradual increases in Voc. Cells with a p-layer 6 film thickness of 8 nm showed only slight increases in Voc with nearly 10 hours of irradiation and any irradiation time beyond that resulted in a gentle decline in Voc. The margin of their Voc decline between the initial period and the following 700 hours of irradiation, was smaller than in cells with a p-layer thickness of 12 nm, and their Voc values after 700 hours of irradiation were roughly the same as those of cells whose p-layer film thickness was 12 nm.

Compared to this, cells with a p-layer film thickness of 4 nm experienced an increase of Voc by 0.04V during the period of up to nearly 10 hours of irradiation, and beyond 10 hours of irradiation Voc began a gentle decline. However, even after 700 hours of irradiation, its Voc is still more elevated than the Voc in the initial period.

There was a differentiation of 0.055V in pre-irradiation Voc between cells with a 12 nm-thick p-layer film and cells with a 4 nm-thick p-layer film, but when irradiation was conducted for more than 10 hours, Voc differentiation dropped to 0.01V. In other words, this indicates that though cells with a thin p-layer film may have low Voc in the initial period, their Voc increases following irradiation, or that their Voc reduction ratio is small and their Voc values are about the same as that of cells with thick p-layer films. The required irradiation time here is 10 hours or more at 1 SUN.

Figure 4:
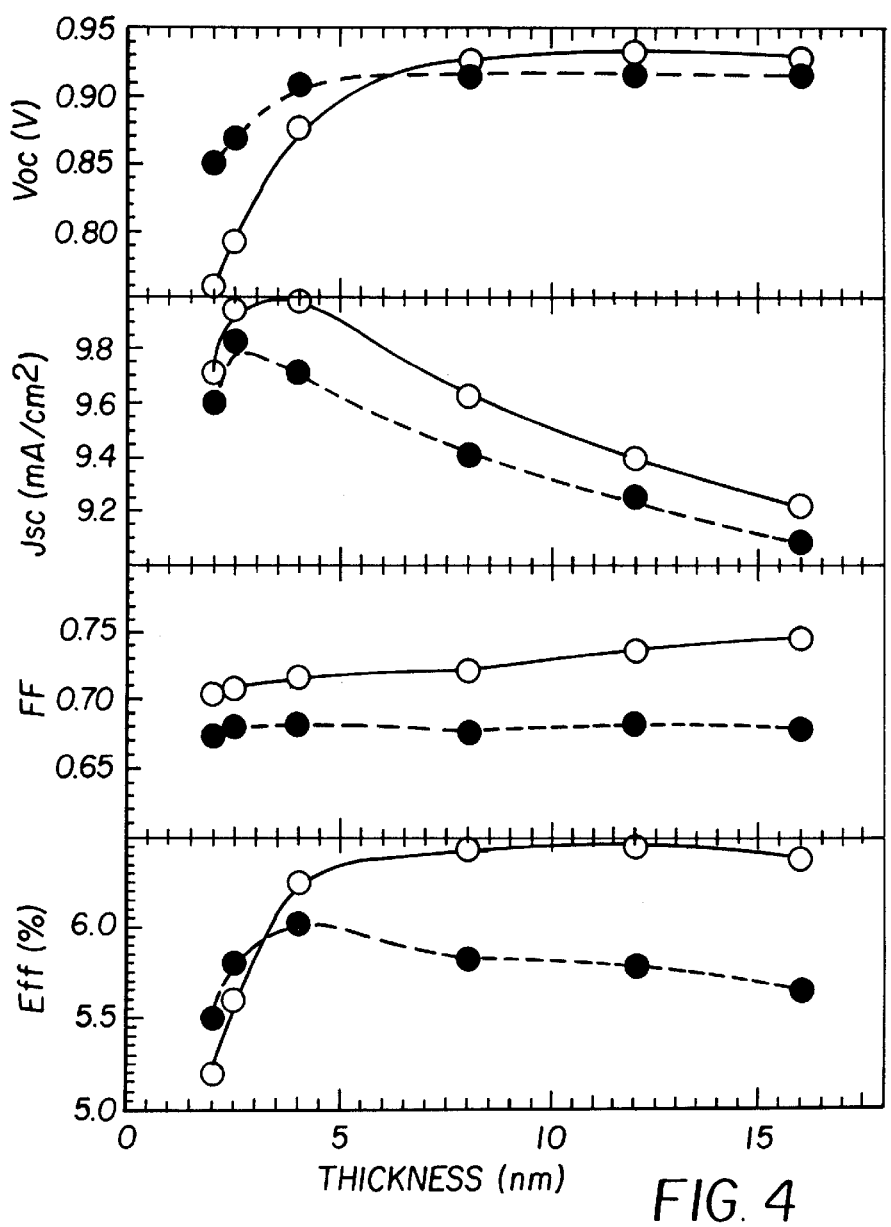
FIG. 4 is a special characteristics graph showing the p-layer film thickness reliability in each of the special characteristics of the solar cell illustrated in FIG. 2.

FIG. 4 shows cells, constructed in the manner of FIG. 2, in which the thicknesses of their p-layer 6 film made of a-SiO have been varied. It is a graph which shows the distinct characteristics of each of the different cells at their initial period (Initial) and after 700 hours of irradiation (Light soaked). The vertical axis shows Voc, Jsc, FF, Eff. The horizontal axis shows the thicknesses of the p-layer film.

In the initial period (represented by ○), the thicker the p-layer film, the more Voc increases. Voc reaches its peak at 12 nm, and gently descends thereafter. Jsc reaches its maximum value at a thickness of 3–4 nm, and gradually decreases at higher thicknesses. FF gently rises as p-layer thickness increases. Efficiency (Eff), too, makes a sudden climb up to 4 nm, followed by gradual increases until it hits its peak at 12 nm.

In comparison, post-irradiation (represented by ●) had the following results: player film in the thin range (5 nm or less) resulted in increases in Voc. The thinner the film, the larger the extent of the increase. P-layer films in the thick range (6 nm or more) resulted in decreases in Voc following irradiation. The thicker the film, the larger the extent of the decline. The results show differences in Voc becoming smaller as the film gets thicker, and virtually constant Voc levels at thicknesses from 4 nm to 16 nm. Jsc values were lower in post-irradiation than those at the initial period, and the extent of the decline is virtually uniform and shows a trend similar to that of initial period values. FF, too, decreases in post-irradiation, but shows nearly the same degree of reliability in relation to the thickness of the p-layer film as it does in the initial period. What these results say about post-irradiation is that as the p-layer thickness goes from thick to thinner, Voc maintains a high value until it reaches 4 nm. Only in the portion where Jsc increases does Eff increase slightly. Furthermore, Eff decreases because post-irradiation Voc decreases when the player film is made thinner. Eff is, therefore, at its maximum value at approximately 4 nm.

In the p-layer thickness range of 3–10 nm, post-irradiation Eff values surpass post-irradiation Eff values in cells with 12 nm thick p-layer films in which initial period Voc values become saturated. In other words, this film thickness range is suitable at 0.25–0.83 times the above-mentioned film thickness of 12 nm.

Figure 1:
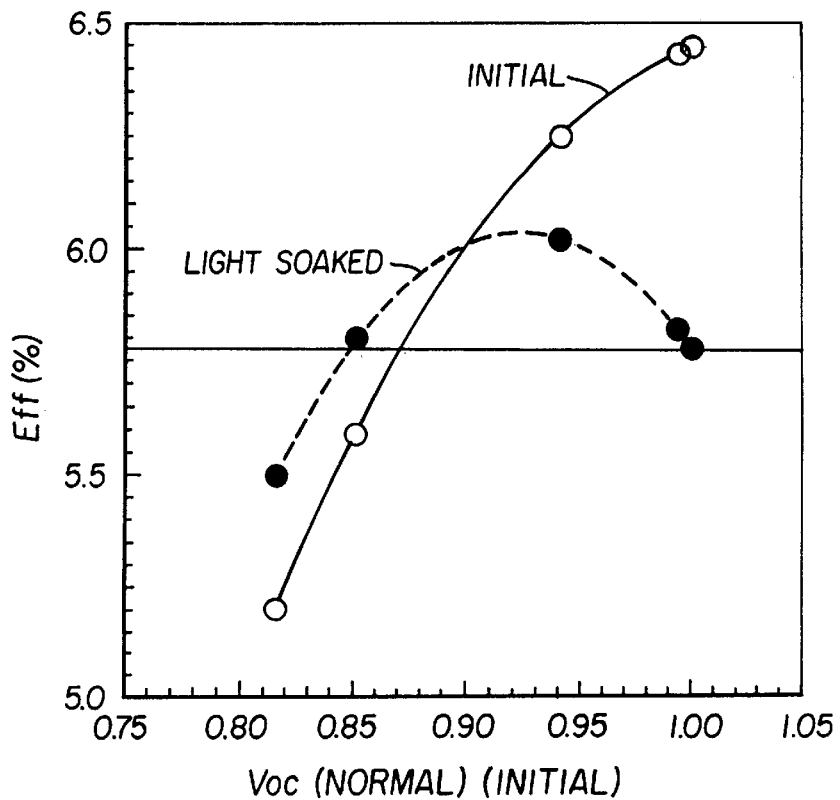
FIG. 1 is a special characteristics graph which shows the relationship between initial period and post-irradiation efficiency "Eff" occurring in a non-single-crystal solar cell in accordance with the invention and initial period Voc whose values were normalized according to the maximum initial period Voc value.

FIG. 1 is a graph of distinct characteristics that takes the Eff of initial period (Initial) and that of 700 hours post-irradiation (Light soaked) and plots them against normalized Voc. The horizontal axis indicates initial period Voc values normalized according to the maximum initial period Voc value. The vertical axis indicates the Eff values of the initial period (Initial) and those of the cell after 700 hours of irradiation (Light soaked). More specifically, the horizontal axis normalized initial Voc according to the initial period Voc of cells with a p-layer film thickness of 12 nm.

Initial period Eff was the greatest at Voc (Normal)=1, and the smaller is Voc (Normal), the more monotonously Eff decreases. However, the post-irradiation Eff reaches its highest point in the neighborhood of Voc (Normal) 0.93, and the Eff is decreased as it becomes farther from the Voc (Normal) 0.93. Further, it surpasses the Eff of Voc (Normal)=1 at the Voc (Normal)=0.85–0.99 range.

Figure 5A:
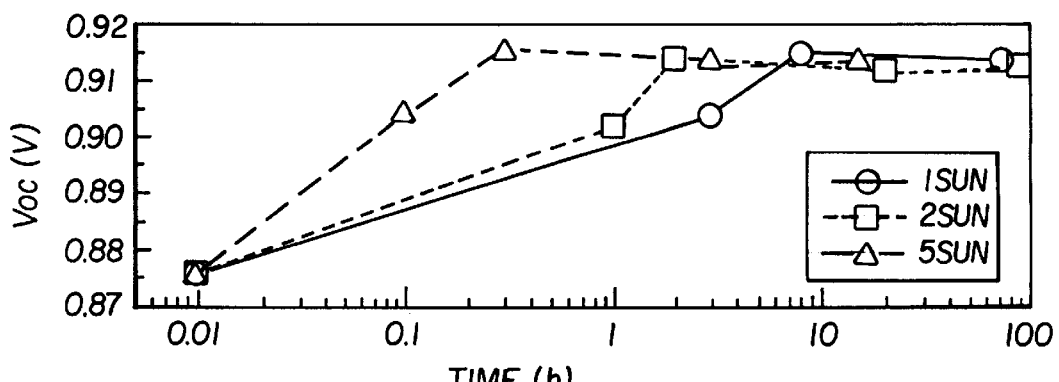
FIG. 5 (a) represents the changes in the open-circuit voltage in relation to irradiation time of the non-singlecrystal solar cell in accordance with the invention, while FIG. (b) represents the changes in open-circuit voltage in relation to (light intensity $[SUN])^2 \times$(time [h])
Figure 5B:
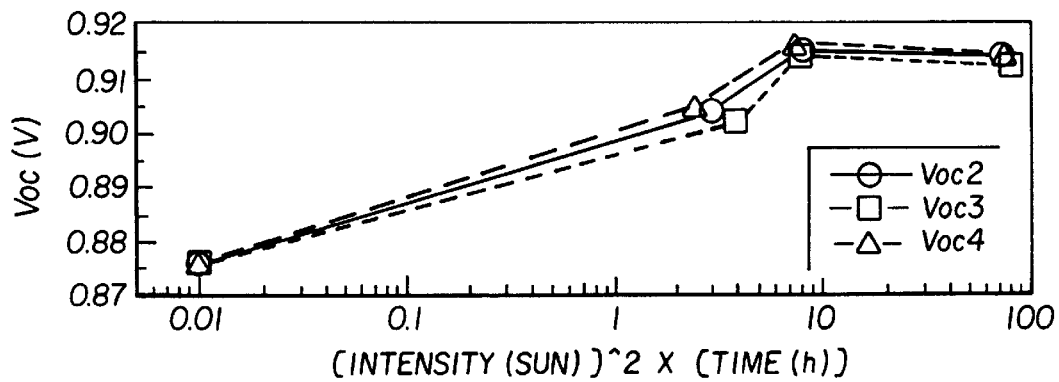

FIG. 5 (a) is a distinct characteristic graph showing the irradiation time reliability of Voc. A cell having the cell construction of FIG. 2 and a p-layer film made from a-SiO with a thickness of 4 nm was used. The horizontal axis indicates irradiation time, the vertical axis indicates Voc, and the parameters were light intensity.

As light intensity increased from 1 SUN, 2 SUN, 5 SUN, Voc increased and the saturation time shortened from 10 h, 2 h, to 0.3. All the maximum Voc values were about the same.

FIG. 5 (b) is a distinct characteristic graph which plots the same data against the equation (light intensity [SUN])$^2$× (time [h]). Voc changes are about the same against (light intensity [SUN])$^2$×(time [h]) at every level of light intensity, and when (light intensity [SUN])$^2$×(time [h]) is at 10 h or more, Voc hits the saturation level. It is believed this is because the recombination frequency is proportionate to the product of electron and electron hole densities generated by irradiation, and this effects the saturation time of light intensity by a power of two.

Iradiation-induced Voc increases were reversible reaction when it returned to initial period values by virtue of heat annealing. The same cell was used in FIG. 5, and irradiation, and 4-hour heat annealing steps at 130° C. were performed repeatedly.

EXAMPLE 2

Figure 6:
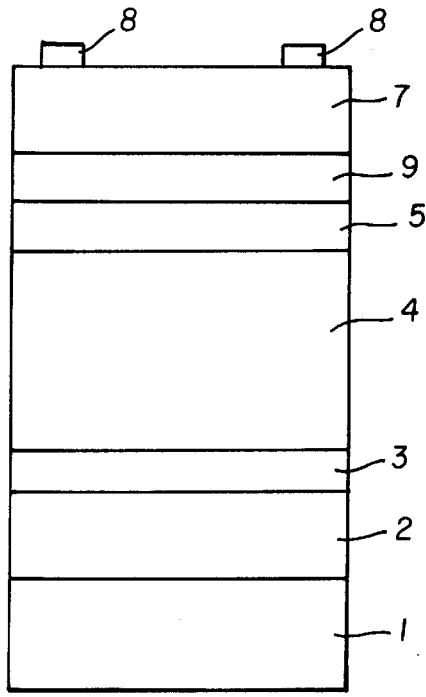
FIG. 6 is cross-sectional drawing of the non-single-crystal solar cell in accordance with a second embodiment of the invention.

FIG. 6 is a cross-sectional diagram of a cell representing a second embodiment of the invention. In this embodiment, p-layer 6 made from a-SiO was replaced with p-layer 9 made from μc-Si as the layer sandwiched between p-i surface layer 5 and the transparent electrode 7. Apart from that, the cell construction and manufacturing method are both the same as for the cell in FIG.2.

The p-layer 9 made from μ-Si was manufactured using the plasma CVD method. The substrate temperature at the time of film manufacturing was 60–200° C., and the reaction pressure was 10–100 Pa. The gas flow volumes were as follows: $SiH_4$ with 1–10 ml/min., $B_2H_6$ with 0.001–0.1 ml/min., and $H^2$ with 100–2000 ml/min.

Irradiation was performed on the cell in FIG. 6 and compared the changes in the distinct characteristics of the solar cells. Whether μc-Si or a-SiO was used in the p-layer, the result was the same: in cells with thick p-layer films, Voc decreased gradually. In cells with thin p-layer films, Voc increases near saturation after 10 hours of irradiation at 1 SUN.

Figure 7:
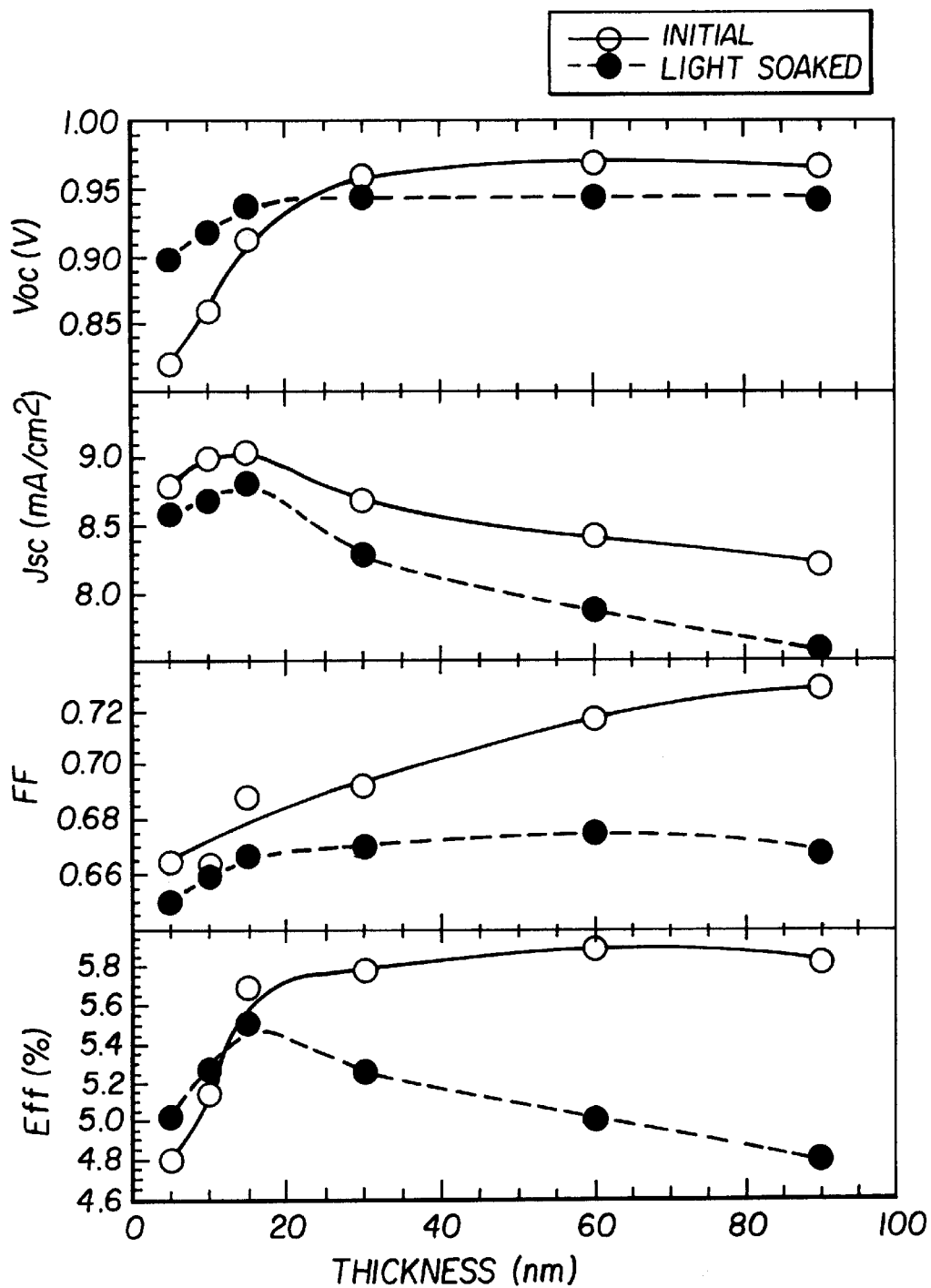
FIG. 7 is a special characteristics graph showing the p-layer thickness reliability in each of the special characteristics of the non-single-crystal solar cell illustrated in FIG. 6.

FIG. 7 is a graph representing cells constructed as shown in FIG. 6 in which the thickness of each of their p-layer 9 made from μc-Si has been changed, and showing the distinct characteristics of each cell at its initial period (Initial) and after 700 hours of irradiation (light soaked). The vertical axis indicates Voc, Jsc, FF, and Eff, while the horizontal axis indicates the thicknesses of the p-layer film.

In the initial period (represented by ○), Voc increases as the p-layer film is made thicker, and decreases slightly after reaching its highest point at 60 nm. Once Jsc hits its highest point at 10–15 nm, it gradually decreases as film thickness increases. FF increases slowly as the p-layer film becomes thicker. Efficiency (Eff) rises quickly to a p-layer film thickness of approximately 15 nm, increases gently thereafter at higher thicknesses, and reaches its peak at a film thickness of 60 nm.

In comparison, in post-irradiation (represented by e), Voc increases are greater than in the initial period for p-layer films in the thin range (20 nm or less), and the thinner the film, the greater the extent of the increase. Voc decreases following irradiation when player films are in the thick range (30 nm or more), and the thicker the film, the greater the extent of the decrease. The results show that Voc variances lessen with film thickness, and at 15–90 nm Voc is roughly constant. Jsc post-irradiation values are lower than its initial period values. The extent of its descent is rather uniform, and shows a trend similar to that of its initial period. FF, too, decreases in post-irradiation, but shows nearly the same reliability levels vis-a-vis p-layer thickness as those in its initial period. In these post-irradiation results, p-layer film thickness starting from the thick end and going to the thinner end are observed, it is seen that Voc is high up to a thickness of 15 nm, and that Eff increases slightly only where there are increases in Jsc. Furthermore, the p-layer film is made thinner, post-irradiation Voc decreases, resulting in decreases in Eff. Eff, therefore, attains its highest value at 15 nm.

In the p-layer thickness range of 5–50 nm, post-irradiation Eff values surpass post-irradiation Eff values in cells with a 60 nm thick p-layer film whose initial period Voc values are the greatest. In other words, this film thickness range is suitable at 0.08–0.83 times the film thickness of 60 nm.

Figure 8:
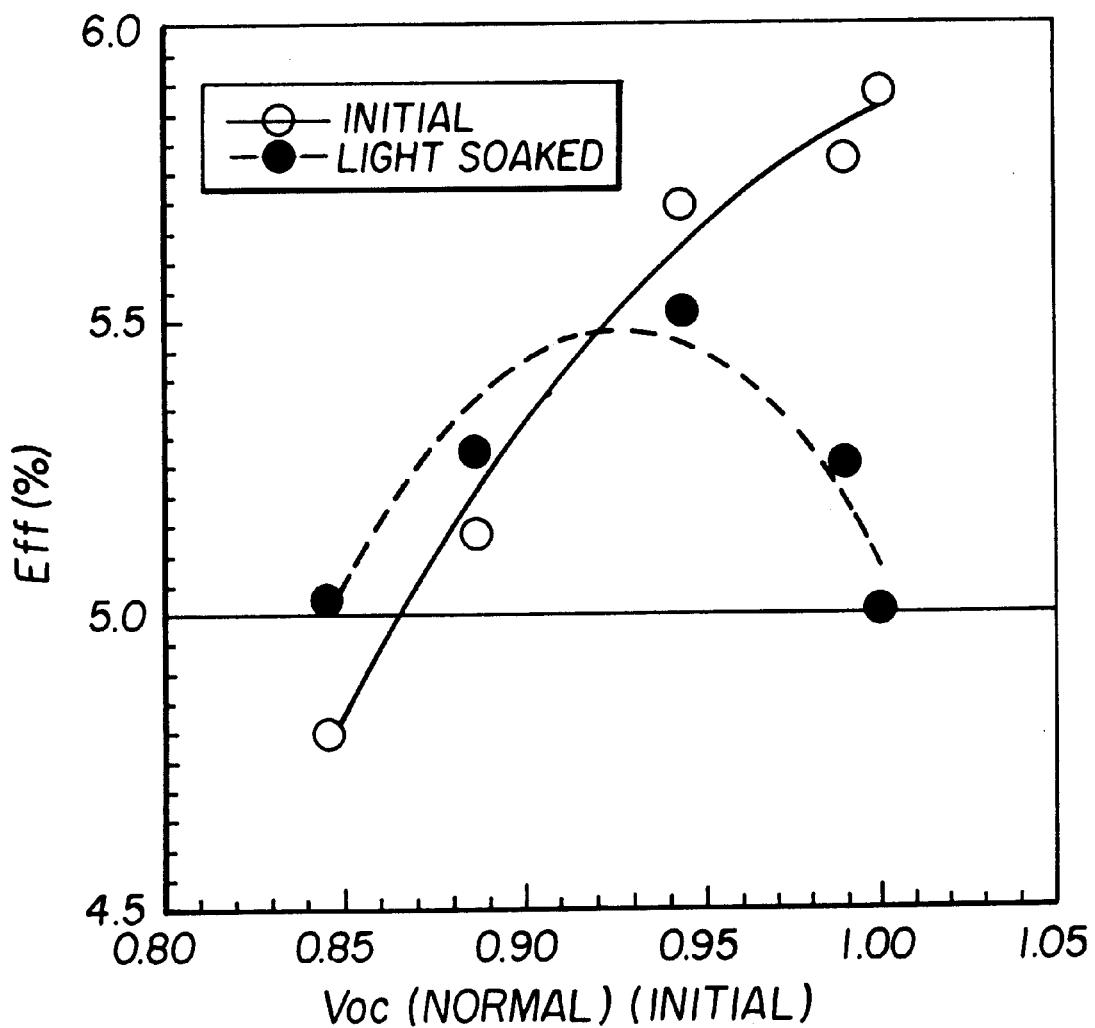
FIG. 8 is a special characteristics graph which shows the relationship between initial period and post-irradiation efficiency "Eff") occurring in non-single-crystal solar cell and initial period Voc whose values were normalized according to the maximum initial period Voc value [Voc (Normal)] in accordance with the second embodiment of the invention.

FIG. 8 is a graph of distinct characteristics that takes the Eff of initial period (Initial) and that of 700 hours post-irradiation (Light soaked) and plots them against normalized Voc. The horizontal axis indicates initial period Voc whose values were normalized according to the maximum initial period Voc value. The vertical axis indicates the Eff values of the initial period (Initial) and those of the cell after 700 hours of irradiation (Light soaked). More specifically, the horizontal axis normalized initial Voc according to the initial period Voc of cells with a p-layer film thickness of 60 nm.

Initial period Eff was the greatest at Voc (Normal)=1, and the smaller is Voc (Normal), the more monotonously Eff decreases. However, the post-irradiation Eff reaches its highest point in the neighborhood of Voc (Normal) 0.93, then heads down from there, getting smaller. Further, it surpasses the Eff of Voc (Normal)=1 cells at the Voc (Normal)=0.85–0.99 range. This trend strongly resembles that of FIG. 1 which described the first embodiment using a-SiO for the p-layer.

EXAMPLE 3

The moment the p-layer film thicknesses was made uniform, and a cell was made with a reduced level of acceptor impurities such as boron in the player, the film thickness at which initial period Voc became saturated became greater. Then, cells with a high acceptor density experienced a low initial period Voc in cells with low levels of acceptor impurities, and an increase in post-irradiation Voc, even at the thickness where Voc becomes saturated. Post-irradiation Eff was higher than in cells with a high level of impurities and with the same film thickness, and it surpassed initial period Voc, surpassing the Eff in cells experiencing Voc (Normal)=1 at a range of 0.85–0.99 Voc (Normal) normalized using the maximum initial period Voc values.

Even when impurity levels are low, initial period Voc becomes saturated at greater thicknesses. For this reason it was decided to utilize a p-layer substantially thinner than the thickness at which Voc becomes saturated, and this, it is believed, is why we got the same results as when we made the p-layer film thinner.

The examples presented up to this point concern cells which possess a p-i interface layer. The fact that Voc increases following irradiation have been concluded about p-i surface layer 5, even if there is no p-i interface layer 5, but the absolute values of Voc and Eff are low and the results received were the same.

It is effective to use the following materials for the p-layer: wide-gap amorphous alloys apart from a-SiO or $\mu$c-Si. Namely, a-SiC, a-SiN, or microcrystals such as $\mu$c-SiO, $\mu$c-SiC and $\mu$c-SiN. It is also effective to use thin-film multicrystal silicon made by virtue of plasma CVD or laser annealing.

In the illustrated examples, glass substrates were used, but metallic substrates or plastic film substrates can also be used. Furthermore, when transparent substrates such as glass plates or transparent plastic film substrates are used, it is also possible to thereon perform successive laminations of the transparent electrode, p-layer, i-layer, n-layer and metallic electrode. Naturally, it is also effective in tandem structures that possess more than two PIN structures.

As described above, this invention brought to light the following: what was optimized in the peculiar characteristics of the initial period was not necessarily optimal for the peculiar characteristics of post-irradiation, and the specific conditions for maximizing the peculiar characteristics of post-irradiation.

In other words, by virtue of this invention, the inventors took non-single-crystal solar cell having at least one PIN junction, namely, the laminating together of a p-type semiconductor layer made from non-single-crystal thin-film, a materially intrinsic i-type semiconductor layer and an n-type semiconductor layer, and adjusted the layer of the p-type semiconductor so as to achieve 0.85–0.99 times the maximum pre-irradiation open-circuit voltage vis-a-vis the thickness of the said p-type semiconductor film. Accordingly, by regulating the film thickness and the impurity concentration therein, increases in the efficiency levels in post-irradiation were realized.

The conditions of irradiation were as follows: 10 hours or more at a light intensity of 1 SUN, or elevating the light intensity of (light intensity [SUN])$^2$×(time [h]) by 10 or more. Following these conditions, increased efficiency with shorter irradiation times were documented.

This invention, therefore, is one that is extremely important and useful with regard to the use of non-single-crystal solar cells for long periods of time.

What is claimed is:

1. A non-single-crystal solar cell including at least one PIN junction comprising:

a laminated p-type semiconductor layer made from non-single-crystal thin-film;

a substantially intrinsic i-type semiconductor layer; and an n-type semiconductor layer;

wherein amorphous silicon oxide is utilized as said p-type semiconductor layer;

wherein the film thickness of said p-type semiconductor layer is set to 0.25–0.83 times that of a p-type layer of amorphous silicon oxide having the maximum pre-irradiation open-circuit voltage;

wherein the film thickness of the p-type semiconductor layer at the maximum pre-irradiation open-circuit voltage is about 12 nm; and wherein the film thickness of the p-type semiconductor layer is set to about 3–10 nm.

2. A non-single-crystal solar cell including at least one PIN junction comprising:

a laminated p-type semiconductor layer made from non-single-crystal thin-film;

a substantially intrinsic i-type semiconductor layer; and an n-type semiconductor layer;

wherein microcrystal silicon is utilized as said p-type semiconductor layer;

wherein the film thickness of said p-type semiconductor layer is set to 0.08–0.83 times that of a p-type layer of microcrystal silicon having the maximum pre-irradiation open-circuit voltage;

wherein the film thickness of the p-type semiconductor layer at the maximum pre-irradiation open-circuit voltage is about 60 nm; and wherein the film thickness of the p-type semiconductor layer is set to about 5–50 nm.

3. A non-single-crystal solar cell as claimed in any one of claims 1 or 2, further comprising:

a p-i interface layer made from non-single-crystal thin film between the layers of said i-type semiconductor and p-type semiconductor.

4. A method of manufacturing a non-single-crystal solar cell as claimed in any one of claims 1 or 2, wherein the device is irradiated for 10 hours or more at a light intensity of 1 SUN.

5. A method of manufacturing a non-single-crystal solar cell as claimed in any one of claims 1 or 2, wherein the device is irradiated under the following conditions: (light intensity (SUN))$^2$×(time (h))>10.

* * * * *